US007888577B2

(12) United States Patent
Alvarez

(10) Patent No.: US 7,888,577 B2
(45) Date of Patent: Feb. 15, 2011

(54) INSTRUMENT AMPLIFICATION SYSTEM

(75) Inventor: Santiago Alvarez, Bletchley (GB)

(73) Assignee: Marshall Amplification PLC, Milton Keynes Buckinghamshire (GB)

( * ) Notice: Subject to any disclaimer, the term of this patent is extended or adjusted under 35 U.S.C. 154(b) by 0 days.

(21) Appl. No.: 12/226,839

(22) PCT Filed: Oct. 8, 2007

(86) PCT No.: PCT/GB2007/003806

§ 371 (c)(1),
(2), (4) Date: Feb. 16, 2009

(87) PCT Pub. No.: WO2008/043990

PCT Pub. Date: Apr. 17, 2008

(65) Prior Publication Data

US 2009/0217807 A1 Sep. 3, 2009

(30) Foreign Application Priority Data

Oct. 9, 2006 (GB) ................................ 0619953.3

(51) Int. Cl.
*H03F 17/00* (2006.01)

(52) U.S. Cl. ......................... 84/600; 381/107; 381/118; 330/1 A

(58) Field of Classification Search ........... 84/600–602; 381/107, 118; 330/1 A, 207 R, 59
See application file for complete search history.

(56) References Cited

U.S. PATENT DOCUMENTS 5,023,915 A * 6/1991 Brown et al. ................ 381/120
5,208,548 A * 5/1993 Van Riezen .................. 330/59
5,393,926 A * 2/1995 Johnson ...................... 84/610
5,700,966 A 12/1997 LaMarra
5,789,689 A * 8/1998 Doidic et al. ................. 84/603
6,350,943 B1 * 2/2002 Suruga et al. ................. 84/603
6,664,460 B1 * 12/2003 Pennock et al. ............... 84/662
6,881,891 B1 * 4/2005 Limacher et al. .............. 84/662
6,969,797 B2 * 11/2005 Brinkman et al. ............. 84/625
6,998,528 B1 * 2/2006 Limacher et al. .............. 84/662

(Continued)

FOREIGN PATENT DOCUMENTS

GB 2405987 3/2005

OTHER PUBLICATIONS

Rocktron Corporation: "Chameleon On-Line. Programmable 24-bit DSP Guitar Preamp. User's Manual." Internet Citation, [Online] 1997, XP007903921. Retrieved from the Internet on Jan. 25, 2008: URL:http://www.manualnguide.com/dl/12586/>.

(Continued)

*Primary Examiner*—David S. Warren
(74) *Attorney, Agent, or Firm*—Harness, Dickey & Pierce, P.L.C.

(57) ABSTRACT

A musical instrument amplification system comprising a footswitch and a main amplification device, its control panel having a variety of controls, such as switches, sliders, dials and the like allowing the user to set a variety of parameters for amplification. A remote footswitch having several controls is connected to the front-panel, the controls may be assigned either to a set of specific amplification parameters, or to the control for a particular parameter, allowing the performer improved access to the amplifier controls whilst performing.

9 Claims, 2 Drawing Sheets

U.S. PATENT DOCUMENTS

Figure 1:
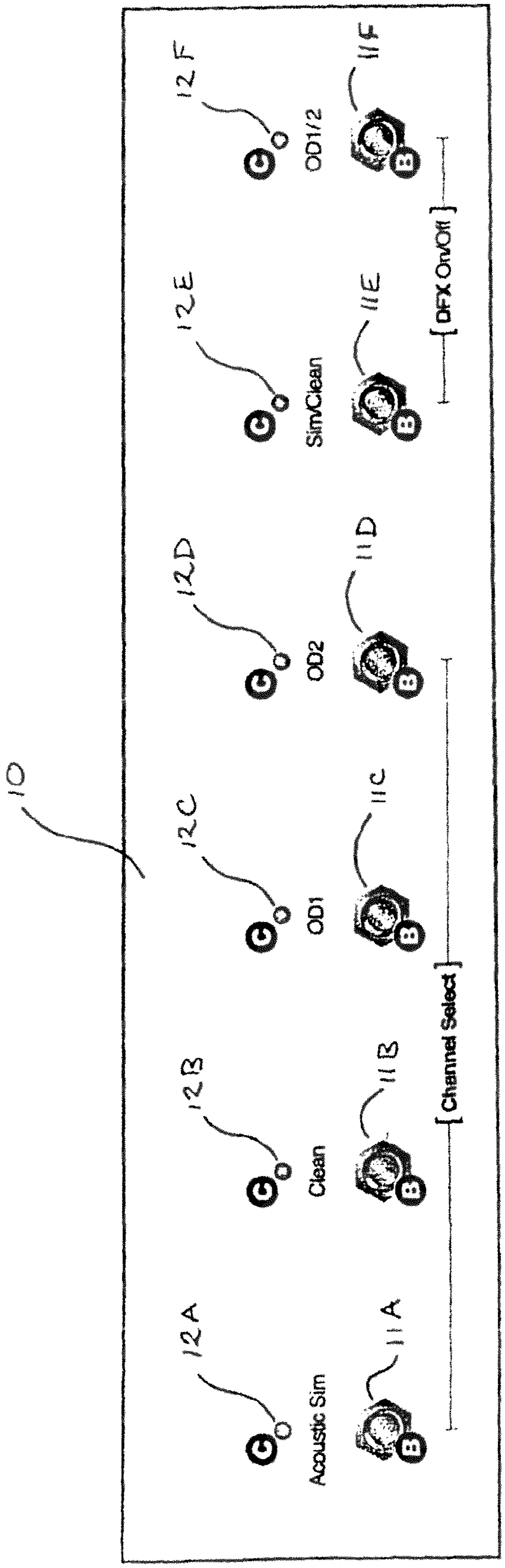
FIG. 1 (PRIOR ART)

| | | | | |
|---|---|---|---|---|
| 7,026,539 | B2 * | 4/2006 | Pennock et al. | 84/662 |
| 7,030,311 | B2 * | 4/2006 | Brinkman et al. | 84/625 |
| 7,081,580 | B2 * | 7/2006 | Brinkman et al. | 84/609 |
| 7,279,631 | B2 * | 10/2007 | Celi et al. | 84/735 |
| 7,601,908 | B2 * | 10/2009 | Ambrosino | 84/742 |
| 7,678,985 | B2 * | 3/2010 | Adams et al. | 84/645 |
| 2003/0052728 | A1 | 3/2003 | Philpott | |
| 2004/0075602 | A1 | 4/2004 | Griesau et al. | |
| 2006/0159291 | A1 * | 7/2006 | Fliegler et al. | 381/118 |
| 2008/0212801 | A1 * | 9/2008 | Schneider | 381/118 |
| 2009/0217807 | A1 * | 9/2009 | Alvarez | 84/745 |

OTHER PUBLICATIONS

Rocktron (Guitar Rack Technology): "All Access, User's Manual." Internet Citation, [Online] 1994, XP007903902. Retrieved from the Internet on Jan. 21, 2008: URL:http://www.manualnguide.com/dl/12552/>.

* cited by examiner

INSTRUMENT AMPLIFICATION SYSTEM

The present invention relates to instrument amplification systems and may for example find use in a footswitch for controlling an instrument amplification device or system.

Instrument amplification systems typically have a variety of controls, which are commonly provided on a front-panel of the amplifier itself. A performer may use these controls to select desired amplification parameters. Broadly speaking, there are two levels of control for the sound that the performer is given: the 'channel', and the particular 'mode' for that channel. The front-panel also allows control over more general settings such as the output volume. Traditionally instrument amplification systems have been remote controlled by a footswitch or a set of them to allow the performer to change channels or modes while playing a musical instrument.

A typical instrument amplifier consists of an input, an electronic circuit to process the signal and an output which can be a signal output or directly a loudspeaker. In the signal processing stages it is typical to have different circuits to provide different sounds from the given input, known as channels. Common examples are clean and distortion channels, which may allow the player to achieve a sound similar to a dean instrument or to the distorted guitar sound associated with rock music.

Typically, channels have their own set of user controls to select the particular parameters of the amplification using that circuit to afford the performer more precise control of the sound. Moreover, within a channel there may be different sounds obtainable, offering variations of the basic channel which are known as 'modes'. The performer can, for example, manipulate the gain, treble, middle and bass via such front-panel controls and also switch different gain or distortion settings, brightness controls, etc.

A performer will, in general, not be able to operate the front-panel controls whilst playing for a variety of reasons: his hands will be occupied with playing the instrument; operating the controls would divert too much of his attention; and it will generally be too awkward to be in close proximity to the front-panel. Currently available footswitches provide one or more buttons that may be pressed with the foot whilst playing the instrument to select a specific channel, thus offering a basic selection of the amplifier functions whilst playing.

Thus, conventional front-panel and footswitch systems present the performer with two undesirable options. Either, the performer has to compromise and limit his performance to a small subset of the available functions of the amplifier, or if the performer wishes to change the mode and other settings, he must attempt to operate an impractical array of different foot switches.

It is an object of the invention to provide the performer with control over a much larger range of the amplifier's functions whilst playing, without placing undue burden on them.

Accordingly, the present invention consists in one aspect in a musical instrument amplification system comprising:

an amplification device having a plurality of amplification parameters;

a first control device comprising a first plurality of controls, the controls operable to allow a user to set the amplification parameters of the amplification device;

a second control device, in remote communication with said first control device, comprising a second plurality of controls, at least one of said controls having a user-definable function, thus being operable to allow a user to control at least one amplification parameter of the amplification device.

According to a second aspect of the present invention there is provided a remote control device for an instrument amplification device, the instrument amplification device having a plurality of amplification parameters, wherein the control device comprises a plurality of controls, at least one of said controls having a user-definable function, thus being operable to allow a user to control at least one amplification parameter of the instrument amplification device.

Examples of the present invention allow the performer to assign the amplifier system controls or switches (or combinations of these) to any of the available remote controller switches, thus overcoming the constraints of having predefined and fixed configurations.

DETAILED DESCRIPTION

Figure 2:
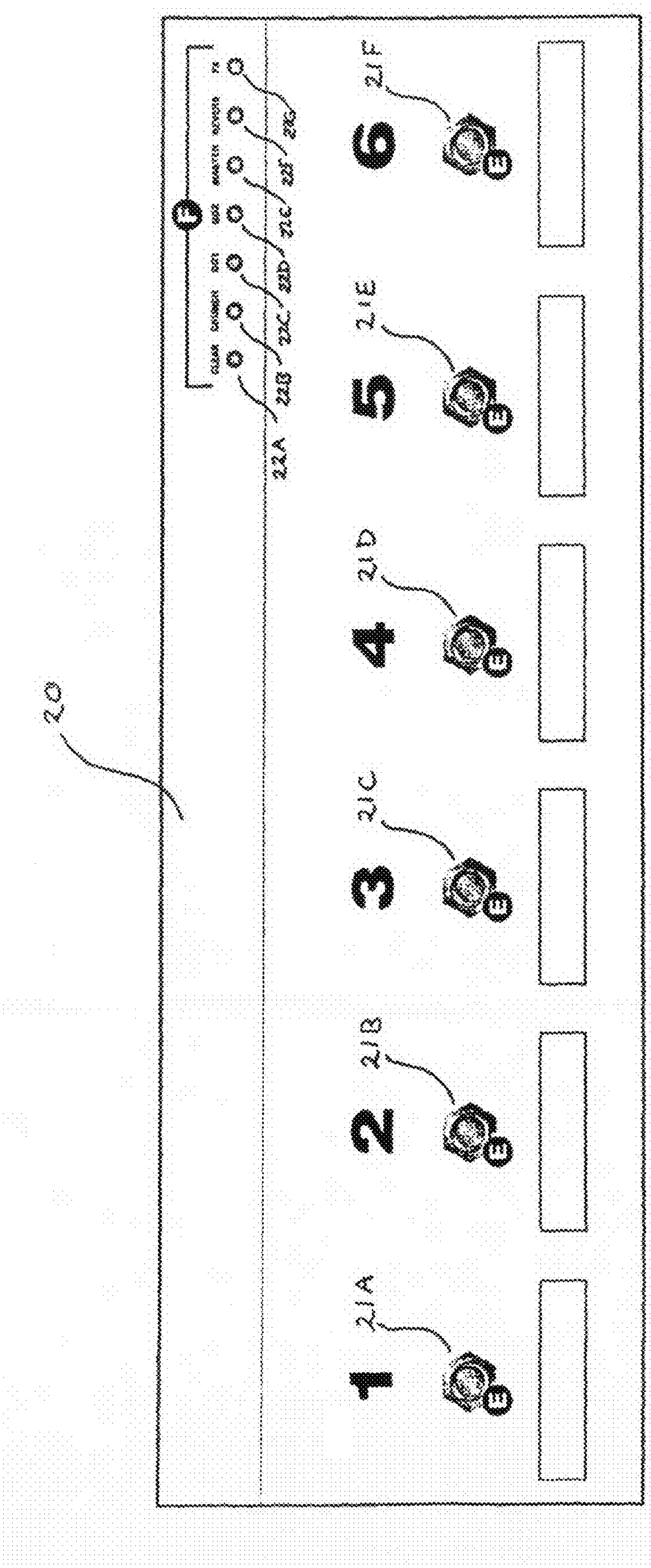

The invention will now be described by way of example with reference to the following figures:

FIG. 1 displays a prior art foot controller;

FIG. 2 displays a foot controller in accordance with an embodiment of the invention.

For the purpose of explaining the principle of the invention reference will be made to a multiple channel instrument amplification system. However, the invention should not be limited to the presented case and may include different channel arrangements with different modes or additional circuits all controlled by the same principle.

FIG. 1 illustrates a conventional footswitch remote controller 10. The footswitch comprises a plurality of buttons 11*a*-11*f*, each of which selects a specific predefined channel. The footswitch also comprises a plurality of LEDs 12*a*-12*f*, each of which corresponds to a button and thus a specific predefined channel. The LEDs become illuminated when the corresponding channel is selected.

FIG. 2 illustrates a footswitch according to an embodiment of the present invention 20. The footswitch comprises a plurality of buttons 21*a*-21*f*. The buttons do not have a predetermined function, and may be assigned by the performer, thus allowing improved access to the available features of the amplifier. The footswitch also comprises a plurality of LED indicators 22*a*-22*g* each of which corresponds to a particular channel of the amplifier. In this way, the performer is made aware of which channel is currently selected, since the buttons no longer correspond to a specific channel as with known footswitches.

The footswitch may be connected to the main amplifier by wires or any other known form of communication such as radio or infrared. The amplifier and/or the footswitch is equipped with a microcontroller or any other electronic processor to allow programming and storing the different configurations.

In this embodiment, two main types of assignation may be performed on each button on the remote controller: key store and preset store.

Key store allows the user to assign a front panel switch to one of the remote controller buttons. This may be achieved, for example, by holding down the desired remote controller switch and while it is being held down simultaneously press the relevant front panel switch. This way, the programmed remote controller switch will replicate the function of the front panel one. The user might, for example, assign remote controller switch 21*a* to the master volume; thereafter, every time the user presses switch 21*a* the volume is progressively increased.

Preset store allows the user to assign a specific combination of parameters selected on the front-panel to a switch on the remote controller. This may be achieved, for example, by holding down the desired remote controller switch for a certain period of time, such as three seconds, and the configuration selected on the front-panel will be mapped to that remote controller switch. That remote controller switch will then recall the programmed amplifier configuration every time it is pressed.

The embodiment pictured in FIG. 2 is a multiple channel device in which each of the channels has several different modes. Each of the channels has its own dedicated mode switches on the front panel which allow the user to select the desired mode. The amplifier will also have some additional circuits like reverberation, external effects or different output levels also selected by means of front panel switches.

This amplifier would then be able to provide multiple different sounds, each one with several possible combinations of effects, reverberation and output levels which would require a prohibitively large conventional footswitch to recreate the same functionality.

Although reference has been made to a multiple channel instrument amplification system, the invention may include different channel arrangements with different modes or additional circuits all controlled by the same principle. Indeed, it is envisaged that any property controlled using conventional amplifier controls may also be controlled using a footswitch according to the present invention.

Additionally, the inventive amplification device may be arranged to be back-compatible with standard non-programmable remote controllers, thus replicating the familiar functionality of such devices.

The invention claimed is:

1. A control device for connection to a musical instrument amplification device, the amplification device having a plurality of amplification parameters, which may be set by use of a first plurality of controls, the control device comprising:

a second plurality of controls, at least one of said controls being a user-definable control, each of said user-definable controls being operable to perform a 'preset store' operation wherein the current set of amplification parameters of the musical amplification device may be stored by said control device, and assigned to one of said user-definable controls, such that thereafter said set of amplification parameters is recalled when said one of the user-definable controls is actuated and each of said user-definable controls being further operable to perform a 'key store' operation wherein the function of one of said user-definable controls is assigned to the function of a selected one of said first plurality of controls, wherein each of said user-definable controls is operated by a single actuation.

2. A control device according to claim 1, wherein said control device is a footswitch.

3. A control device according to claim 1, wherein said 'preset store' operations comprises holding said one of said user-definable controls in an actuated position for a pre-determined period of time and, thereafter, the stored set of amplification parameters is recalled by actuating said one of said user-definable controls for a shorter period of time.

4. A control device according to claim 1, wherein said 'key store' operation further comprises actuating said selected one of said first plurality of controls simultaneously with said one of said user-definable controls.

5. A musical device amplification system comprising:

a musical instrument amplification device, the amplification device having a plurality of amplification parameters, which may be set by use of a first plurality of controls; and a control device in remote communication with the musical amplification device, the control device comprising:

a second plurality of controls, at least one of said controls being a user-definable control, each of said user-definable controls being operable to perform a 'preset store' operation wherein the current set of amplification parameters of the musical amplification device may be stored by said control device, and assigned to one of said user-definable controls, such that thereafter said set of amplification parameters is recalled when said one of the user-definable controls is actuated, and each of said user-definable controls being further operable to perform a 'key store' operation wherein the function of one of said user-definable controls is assigned to the function of a selected one of said first plurality of controls, wherein each of said user-definable controls is operated by a single actuation.

6. A musical device amplification system according to claim 5, wherein the first plurality of controls is greater in number than the second plurality of controls.

7. A musical device amplification system according to claim 5, wherein said control device is a footswitch.

8. A musical device amplification system according to claim 5, wherein said 'preset store' operation comprises holding said one of said user-definable controls in an actuated position for a pre-determined period of time and, thereafter, the stored set of amplification parameters is recalled by actuating said one of said user-definable controls for a shorter period of time.

9. A musical device amplification system according to claim 5, wherein said 'key store' operation further comprises actuating said selected one of said first plurality of controls simultaneously with said one of said user-definable controls.

* * * * *